United States Patent
Hsieh et al.

(10) Patent No.: US 6,635,922 B1
(45) Date of Patent: Oct. 21, 2003

(54) METHOD TO FABRICATE POLY TIP IN SPLIT GATE FLASH

(75) Inventors: Chia-Ta Hsieh, Tainan (TW); Yai-Fen Lin, Non-Tour (TW); Hung-Cheng Sung, Hsin-chu (TW); Jack Yeh, Hsin-chu (TW); Di-Son Kuo, Chu Pei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/654,829

(22) Filed: Sep. 5, 2000

Related U.S. Application Data (62) Division of application No. 09/298,931, filed on Apr. 26, 1999.

(51) Int. Cl.[7] .............................. H01L 29/788
(52) U.S. Cl. ............... 257/317; 257/314; 257/315; 257/321
(58) Field of Search ................ 257/317, 315, 257/321, 314

(56) References Cited

U.S. PATENT DOCUMENTS

| | | | |
|---|---|---|---|
| 4,975,384 A | | 12/1990 | Baglee .................. 437/43 |
| 5,008,212 A | * | 4/1991 | Chen .................... 437/43 |
| 5,476,801 A | | 12/1995 | Keshtbod ................ 437/43 |
| 5,554,553 A | * | 9/1996 | Harari .................. 437/43 |
| 5,597,751 A | | 1/1997 | Wang ................... 437/43 |
| 5,766,988 A | * | 6/1998 | Cho et al. .............. 438/159 |
| 5,767,005 A | * | 6/1998 | Doan et al. ............. 438/593 |
| 5,893,757 A | * | 4/1999 | Su et al. ............... 438/713 |

* cited by examiner

Primary Examiner—Sheila V. Clark
Assistant Examiner—N. Drew Richards
(74) Attorney, Agent, or Firm—George O. Saile; Stephen B. Ackerman (57) ABSTRACT

A method is provided to form a sharp poly tip to improve the speed of a split-gate flash memory. The sharp poly tip is provided in place of the conventional gate bird's beak (GBB) because the latter requires the forming of thick poly-oxide which is more and more difficult in the miniaturized circuits of the ultra scale integrated technology. Furthermore, it is well known that GBB encroaches under the gate edge in a split-gate flash and degrades the programmability of submicron memory cells. The sharp poly tip of the invention is provided by forming a tapered floating gate through a high pressure etch such that the tip of the upper edge of the floating gate under the poly oxide is sharper and more robust, and, therefore, less susceptible to damage during the manufacture of the cell. The invention is also directed to a semiconductor device fabricated by the disclosed method.

4 Claims, 6 Drawing Sheets

METHOD TO FABRICATE POLY TIP IN SPLIT GATE FLASH

This is a division of patent application Ser. No. 09/298,931, filing date Apr. 26, 1999, A Method To Fabricate Poly Tip In Split Gate Flash, assigned to the same assignee as the present invention.

BACKGROUND OF THE INVENTION (1) Field of the Invention

The present invention relates to split-gate memory cells used in flash EEPROMs (Electrically Erasable Programmable Read Only Memories), and in particular, to a method of forming a poly tip in split-gate flash cells.

(2) Description of the Related Art

Programming (coding) and erasing (decoding) of memory cells is accomplished by tunneling of electrons through the thin oxide between the substrate and the floating gate in a split-gate flash memory cell. The effectiveness of the program/erase modes, that is, the speed with which they can be performed, can be enhanced by providing a protrusion for the floating gate of the split-gate cell. Normally, the protrusion is formed by poly oxidation, that is, by oxidizing the polysilicon of which the floating gate comprises; That is, the oxidized portion of the poly-gate is used as a hard mask to form a protruding, so-called gate bird's beak (GBB), or, a tip, which in turn enhances the well-known Fowler-Nordheim (F-N) tunneling for the programming and erasing of an EEPROM cell. However, thick poly is needed in order to grow a thick poly-oxide hard-mask. Thick poly, on the other hand, increases gate coupling ratio (GCR), a parameter which is well-known in the art. Increased GCR then degrades the programming and erasing function of the cell. Especially, with the fast pace of miniaturization and scaling down of devices, it s becoming more and more difficult to form thick poly-oxides because of the oxide thinning effect.

Furthermore, the forming of a GBB must be optimized carefully, for, otherwise, the GBB can encroach under the gate edge and degrade the programmability of submicron memory cells. That is, the dimensions and shape of the GBB, which is described below more in detail in relation to nonvolatile memories, play an important role in transferring current to and fro between the substrate and the floating gate, and hence the charging speed of the memory cell, and the amount of surface current leakage that takes place around and near the bird's beak. It is disclosed in this invention a method of forming a poly tip, in place of the conventional GBB, by forming a tapered floating poly-gate, whereby the tip is more controllable and sharper and therefore the program/erase mode of the split-gate flash memory cell is more enhanced.

The shape and size of different portions of memory cells have different effects on the performance of the memory cells in different ways. Thus, with the one-transistor memory cell, which contains one transistor and one capacitor, many variations of this simple cell have been advanced for the purposes of shrinking the size of the cell and, at the same time, improve its performance. The variations consist of different methods of forming capacitors, with single, double or triple layers of polysilicon, and different materials for the word and bit lines. Another variation which is disclosed in this invention relates to the tapered shape of the edge of the floating gate which significantly affects the erase speed of split-gate flash memory cells.

Memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Figure 1:
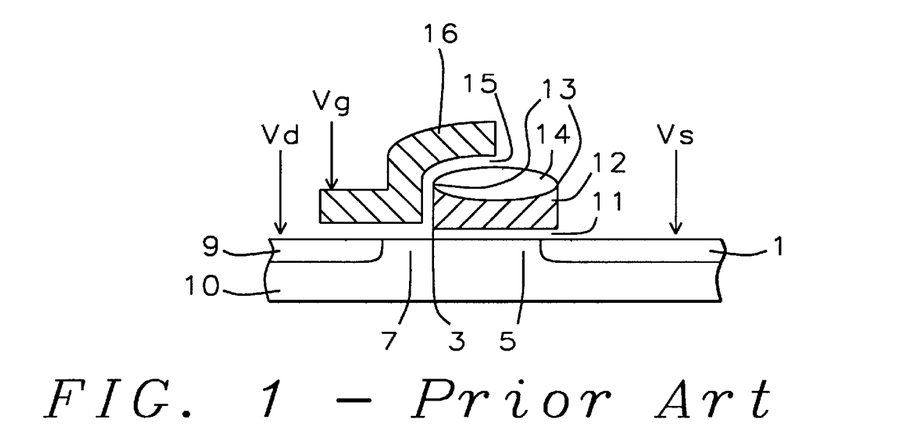
FIG. 1 is a cross-sectional view of a portion of a semiconductor substrate showing a split-gate flash memory cell of prior art.

Most conventional flash-EEPROM cells use a double-polysilicon (poly) structure of which the well known split-gate cell is shown in FIG. 1. The forming of the cell is shown in FIGS. 2a–2f which will be described shortly. In the final form of the cell shown in FIG. 1, There, a MOS transistor is formed on a semiconductor substrate (10) having a first doped region (1), a second doped region (9), a channel region (5), a gate oxide (11), a floating gate (12), intergate dielectric layer (15) and control gate (16). Substrate (10) and channel region (5) have a first conductivity type, and the first (1) and second (9) doped regions have a second conductivity type that is opposite the first conductivity type.

As seen in FIG. 1, the first doped region, (1), lies within the substrate. The second doped region, (9), lies within substrate (10) and is spaced apart form the first doped region (1). Channel region (5) lies within substrate (10) and between first (1) and second (9) doped regions. Gate oxide layer (11) overlies substrate (10). Floating gate (12) covered by poly-oxide (14), and to which there is no direct electrical connection, and which overlies substrate (10), is separated from substrate (10) by a thin layer of gate oxide (11) while control gate (16), to which there is direct electrical connection, is generally positioned over the floating gate with intergate oxide (15) therebetween.

In the structure shown in FIG. 1, control gate (16) overlaps the channel region, (7), adjacent to channel (5) under the floating gate, (12). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (7) determines the cell performance. Furthermore, the shape of the edge (3) and, in particular, that of edge (13) can affect the programming of the cell. It is disclosed in this invention that the edge (13) can be shaped differently to have a sharp and robust tip. This is accomplished by forming a tapered floating gate as disclosed later in the embodiments of the present invention.

To program the transistor shown in FIG. 1 which shows the placement of gate, source and drain voltages or Vg, $V_s$ and $V_d$, respectively, charge is transferred from substrate (10) through gate oxide (11) and is stored on floating gate (12) of the transistor. The amount of charge is set to one of two levels to indicate whether the cell has been programmed "on" of "off." "Reading" of the cell's state is accomplished by applying appropriate voltages to the cell source (1) and drain (9), and to control gate (16), and then sensing the amount of charge on floating gate (2). To erase the contents of the cell, the programming process is reversed, namely, charges are removed from the floating gate by transferring them back to the substrate through the gate oxide.

This, programming and erasing of an EEPROM is accomplished electrically and in-circuit by using Fowler-Nordheim (F-N) tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. And, as stated earlier, the gate bird's beak (GBB) is known to enhance F-N tunneling.

In prior art, protrusions other than GBB have been used to enhance the operation of flash memory cells. For example, Kesthood in U.S. Pat. No. 5,476,801 discloses a sharp tip formed on a poly spacer in order to affect erase operation by tunneling electrons from the tip to the control gate of the cell. The cell is formed by forming the drain regions into the substrate through openings in a first insulator that is preferably the field oxide. A second insulator is deposited over the first insulator, over the substrate and along the side-walls of the openings and is preferably a thin layer so that the opening is covered with a thin insulating layer. The insulated opening is filled with a first doped polysilicon layer. The field oxide is selectively removed. A gate oxide is grown and a second polysilicon layer is formed and then etched to form spacers along the edges of the first polysilicon/second insulator structure. The second polysilicon is selectively etched and a tunneling insulator layer is formed thereover. A third polysilicon layer is formed over the tunneling insulator.

Baglee in U.S. Pat. No. 4,975,384, on the other hand, discloses an EEPROM cell using trench edge tunneling. The trench has bottom corners sufficiently sharp so as to enhance the likelihood of tunneling between corner regions of the trench and the floating gate over that between planar surface regions of the trench and floating gate. In still another approach, Wang, in U.S. Pat. No. 5,597,751 teaches a method of forming a memory cell where there is no shorting problem between a floating gate and a source/drain region of the substrate of the cell by depositing a thick spacer oxide layer on top of the floating gate and the source/drain region to a sufficient thickness such that electrical insulation is provided thereinbetween.

In still a different approach, Cho, et al., in U.S. Pat. No. 5,766,988 show a method of fabricating a thin film transistor with a negatively sloped gate. According to Cho, et al., a thin film transistor may include an insulation substrate, a gate electrode formed to have a negative slope at one side thereof on the insulation substrate, an insulation film side-wall formed at the other side of the gate electrode, a gate insulation film formed on the insulation substrate, gate electrode and side-wall, a semiconductor layer formed on the gate insulation film, impurity diffusion regions selectively formed within the semiconductor layer over the gate electrode, the side-wall and the insulation substrate on the other side of the gate electrode, and a channel region formed within the semiconductor layer at the side of the gate electrode having the negative slope.

It is disclosed in this invention a simpler and different method of forming sloped or tapered side-walls on the floating gate of a split-gate flash memory cell for the purposes of forming a sharper poly tip on the same floating gate.

SUMMARY OF THE INVENTION

It is therefore an object of this invention to provide method of forming a sharp poly tip to improve erase speed in split-gate flash memory.

It is another object of this invention to provide a method of forming a tapered floating gate in a split-gate flash memory.

It is yet another object of this invention to provide a method of etching an opening in a nitride layer to have a tapered sidewall in a split-gate flash.

It is still another object of the present invention to provide split-gate flash memory cell having a sharp poly tip on the tapered floating gate of the cell.

These objects are accomplished by providing a silicon substrate having a plurality of active and field regions defined; forming a pad oxide layer over said substrate; forming a nitride layer over said pad oxide layer; forming forming a nitride layer over said pad oxide layer; forming and patterning a first photoresist layer over said pad oxide layer to form a photoresist mask with a pattern corresponding to the floating gate of said split-gate flash memory cell; etching said nitride layer through said photoresist mask to form an opening with a tapered profile reaching said pad oxide layer underlying said nitride layer; removing said first photoresist layer; removing said pad oxide layer exposed at the bottom of said opening with a tapered profile in said nitride layer; growing gate oxide layer at the bottom of said opening with said tapered profile in said nitride layer; forming a first polysilicon layer over said substrate including said opening with a tapered profile; performing chemical-mechanical polishing (CMP) of said first polysilicon layer; oxidizing said fist polysilicon layer formed in said opening with a tapered profile, thus forming a sharp poly tip at the edge of said opening; removing said nitride layer; removing said pad oxide layer; forming an interpoly oxide layer over said substrate; forming a second polysilicon layer over said interpoly oxide; and patterning said second polysilicon layer with a second photoresist mask having control gate pattern to form a control gate to complete the forming of said split-gate flash memory cell having said sharp poly tip.

These objects are further accomplished by providing a split-gate flash memory cell having a sharp poly tip formed on the tapered wall of the floating gate of a split-gate flash memory cell.

BRIEF DESCRIPTION OF THE DRAWINGS

FIGS. 3a–3i show the preferred embodiments of the present invention, and more specifically:

DESCRIPTION OF THE PREFERRED EMBODIMENTS

Referring now to the drawings, in Particular to FIGS. 3a–3i there is shown steps of forming a split-gate flash memory cell having a sharp poly tip wherein the floating gate has a tapered sidewall. As presented earlier, the shape and size of the tip, or "beak" in the conventional sense, is important in that the Fowler-Nordheim (F-N) tunneling that is used in programming and erasing of an EEPROM cell is enhanced usually by providing, what is known as a gate bird's beak (GBB) at the corner of a gate as a gate bird's beak (GBB) at the corner of a gate structure of the memory cell. However, the conventional "beak" of the bird's beak is usually long and elongated, thus increasing the size of the cell and at the same time providing paths for current leakage and, therefore, low memory speed. Also, the GBB, because it is long, is easily damaged during the subsequent process steps such as during the forming of the interpoly oxide over the floating gate. Thus, in order to alleviate some of these problems, a different method of forming the beak, or, the poly tip, is disclosed in the embodiments specified below. However, first, the current practice in the present manufacturing line, where floating gates with straight walls are formed, will be shown in FIGS. 2a–2f and then the preferred embodiments will be disclosed in FIGS. 3a–3i.

Figure 2A:
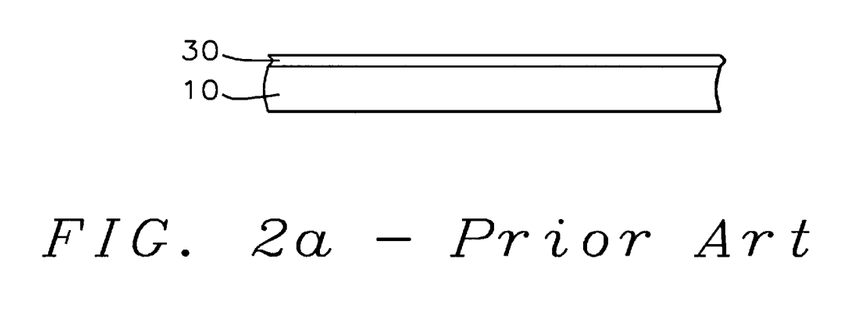
FIGS. 2a–2f are cross-sectional views of a portion of a semiconductor substrate showing the steps of forming a split-gate flash memory cell having a gate birds' beak, according to present practice in the manufacturing line.
Figure 2B:
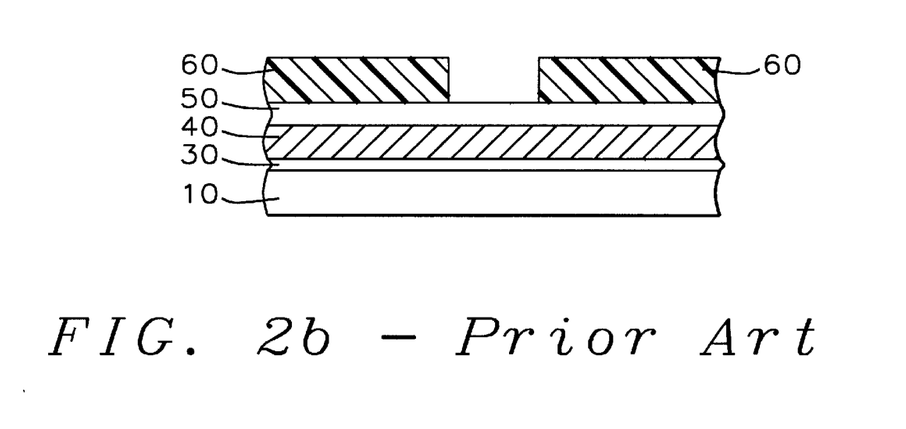
Figure 2C:
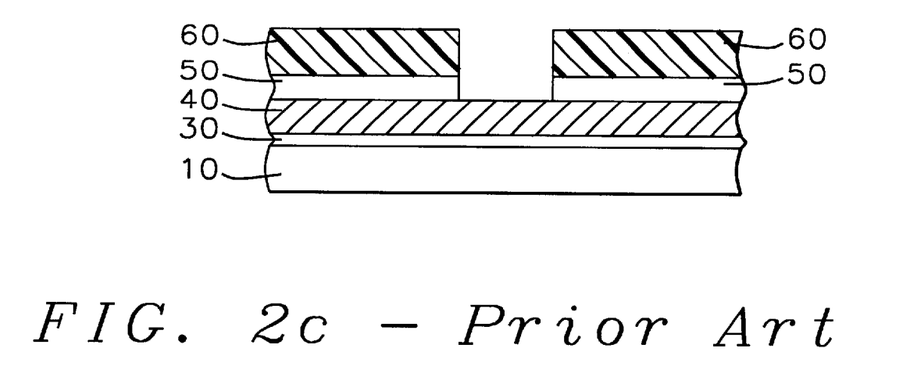
Figure 2D:
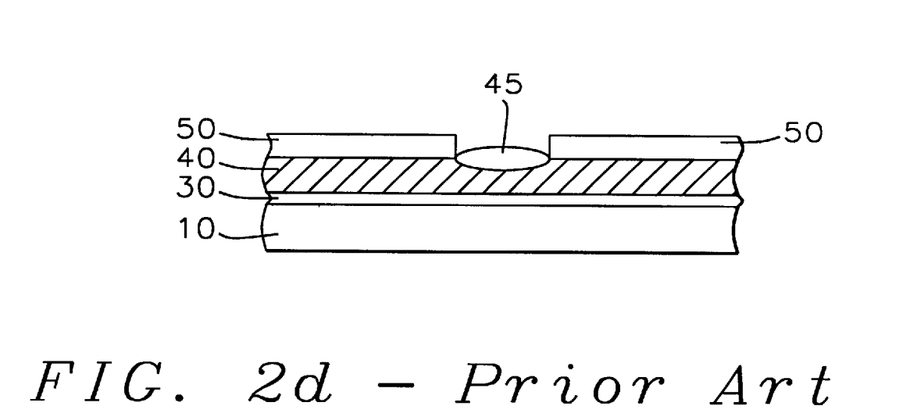
Figure 2E:
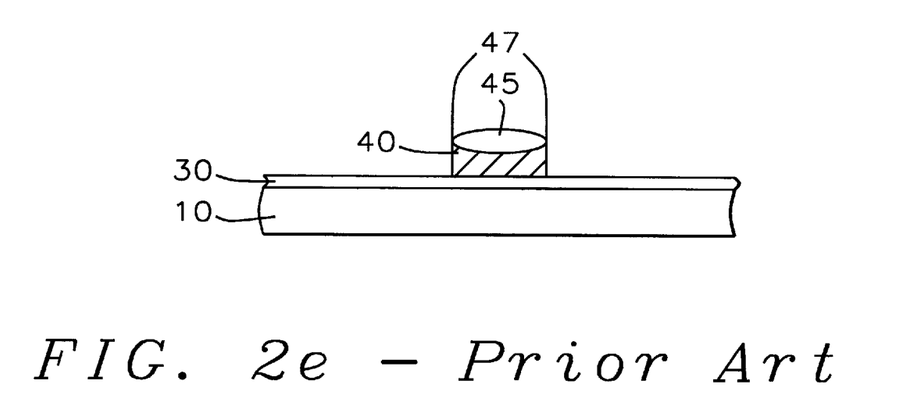
Figure 2F:
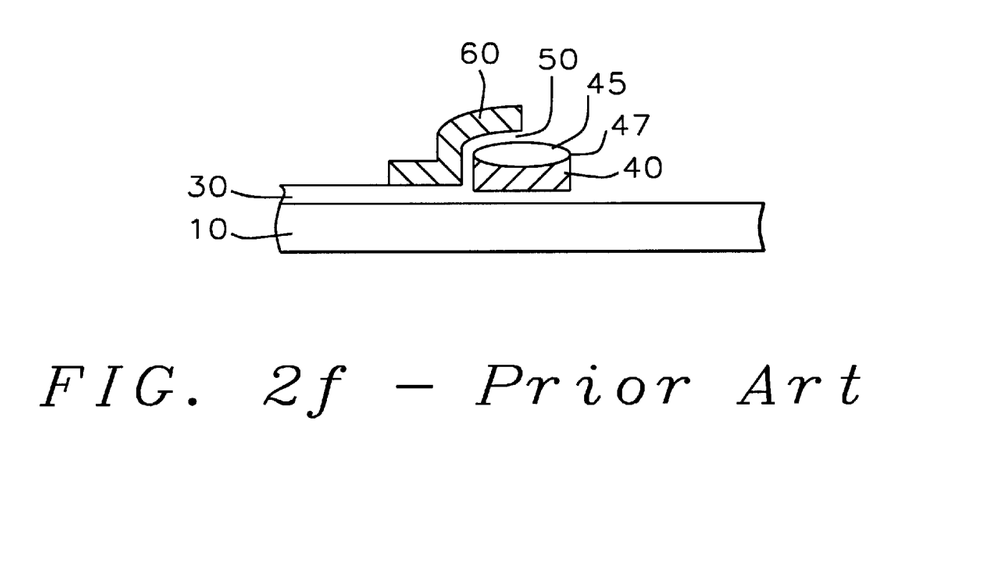

In FIG. 2a, layer of gate oxide (30) is thermally grown over substrate (10) using conventional methods. Next, a first polysilicon layer (40) is formed followed by the deposition of nitride layer (50). A photoresist layer (60) is then spun over the substrate and then patterned with a floating gate pattern as shown in FIG. 2b, which in turn, is etched into the nitride layer (50) as shown in FIG. 2c. The photoresist layer, which is no longer needed, is removed. Next, the first polysilicon that is exposed in the pattern openings in the nitride layer is oxidized to form polyoxide (45) as shown in FIG. 2d. Subsequently, the nitride layer is removed where now polyoxide (45) serves as a hard mask to remove all the first polysilicon portions except those that are covered by the polyoxide (FIG. 2e). As is well known in the art, this is usually accomplished by main etch followed by over-etch. It is at this etching step that the corner edge (47) is usually rounded off, as seen in FIG. 2e, which is not desirable for achieving fast program erase speed described below. It will be shown below in the preferred embodiments of this invention that by employing a different process step, the sharpness of corner edge (47) can be preserved such that charge transfer (33) between substrate (10) and floating gate (40), and then the charge transfer (53) between the floating gate and control gate, (60), is fast. The control gate is formed by depositing a second polysilicon layer over intergate layer (50), also known as interpoly, which separates the two polysilicon layers, namely, the floating polygate and the control polygate, as shown in FIG. 2f.

Figure 3A:
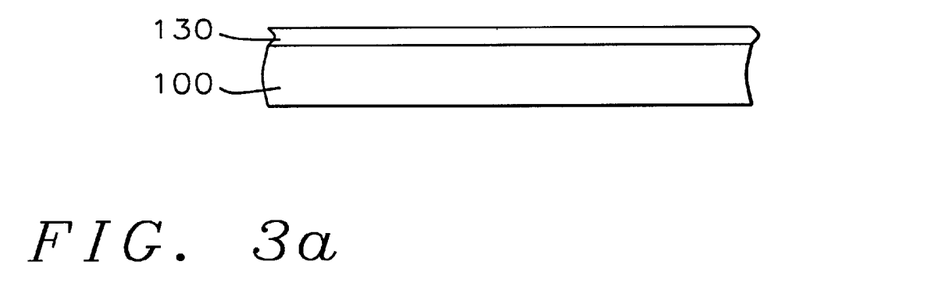
FIG. 3a is a cross-sectional view of a portion of a semiconductor substrate showing the forming of pad oxide, according to this invention.

Now referring to the preferred embodiment shown in FIGS. 3a–3i, and in particular to FIG. 3a, pad oxide layer (130) is formed over substrate (100), preferably silicon, to serve as an etch stop when etching nitride layer (140) to be formed next. Pad oxide (130) can be formed by thermal oxidation process at a temperature between about 850 to 950° C. Alternatively, the pad oxide can be formed by an atmospheric or low pressure chemical vapor deposition (LPCVD) process as is well known. Pad oxide layer (130) has a thickness between about 100 to 250 angstroms (Å).

Figure 3B:
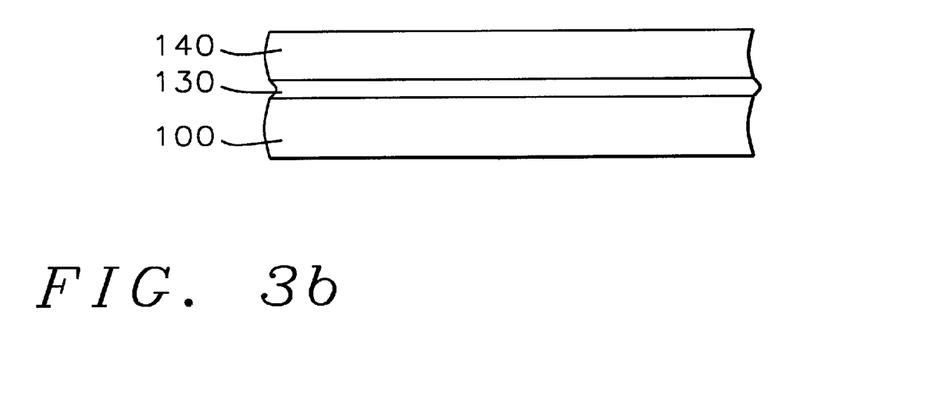
FIG. 3b is a cross-sectional view of a portion of a semiconductor substrate showing the forming of a nitride layer over the pad oxide of FIG. 3a, according to this invention.
Figure 3C:
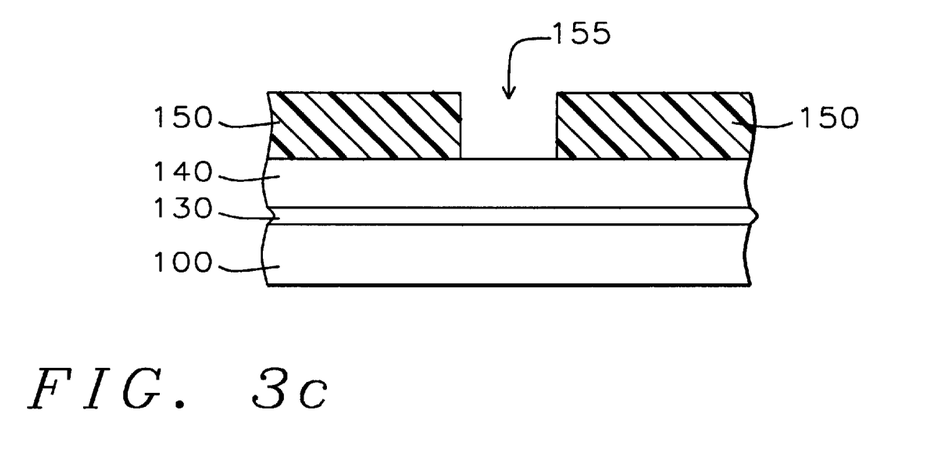
FIG. 3c is a cross-sectional view of a portion of a semiconductor substrate showing the forming and patterning of a photoresist layer over the nitride layer of FIG. 3b, according to this invention.

Nitride layer (140) shown in FIG. 3b is formed by reacting dichlorosilane ($SiCl_2H_2$) with ammonia ($NH_3$) in an LPCVD at a temperature between about 750 to 850° C. The preferred thickness of the nitride layer is between about 800 to 2000 Å. This is followed by forming a photoresist mask (150) having patterns (155) over the nitride layer corresponding to areas where floating gates are to be defined as shown in both FIGS. 3c and 3d. Photoresist layer (150) preferably has a thickness between about 5000 to 10000 Å. The patterns are then etched into the nitride layer (140) forming openings (145) where the underlying pad oxide layer (130) is exposed. Subsequently, the photoresist layer is removed using oxygen plasma ashing.

Figure 3D:
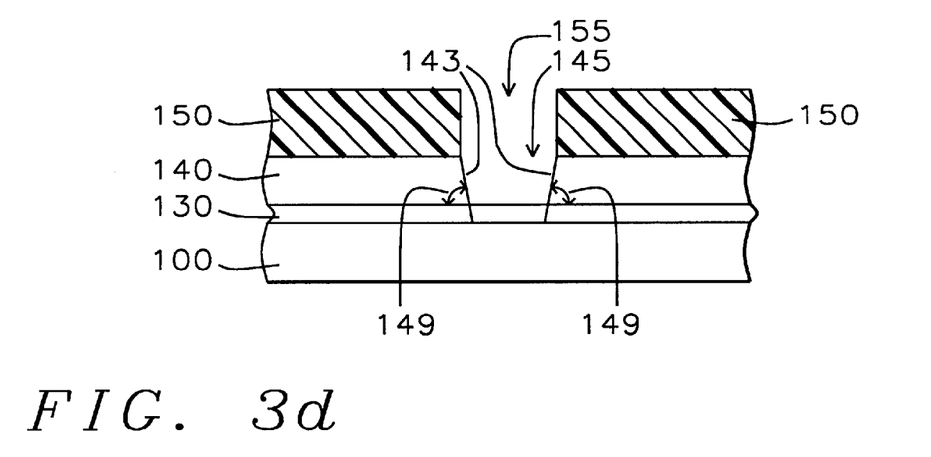
FIG. 3d is a cross-sectional view of a portion of a semiconductor substrate showing thee forming of a tapered opening in the nitride layer of FIG. 3c, according to this invention.

The etching of nitride layer (140) is important because the resulting opening must have tapered walls (143) as shown in FIG. 3d. It is in fact a main feature and key aspect of the present invention that the etch is a high pressure dry etch in the range between 200 to 900 milli torr (mTorr) using gases HBr, $O_2$ and $SF_6$ at flow rates between about 10 to 50 sccm, 1 to 20 sccm and 20 to 80 sccm, respectively. It will be known to those skilled in the art that, conventionally, etching is performed to yield vertical walls. However, it has been found in the present practice in the manufacturing line that with straight and vertical walls, it is difficult to form the protrusion needed in the floating gate to be formed to aid in the F-N tunneling as will be shown in more detail below. Thus, accordingly, it has also been found that the slope of the tapered walls (143) must have an angle (149) between about 60 to 80 degrees from the horizontal, as shown in FIG. 3d to be effective in the forming of the poly tip of this invention.

Figure 3E:
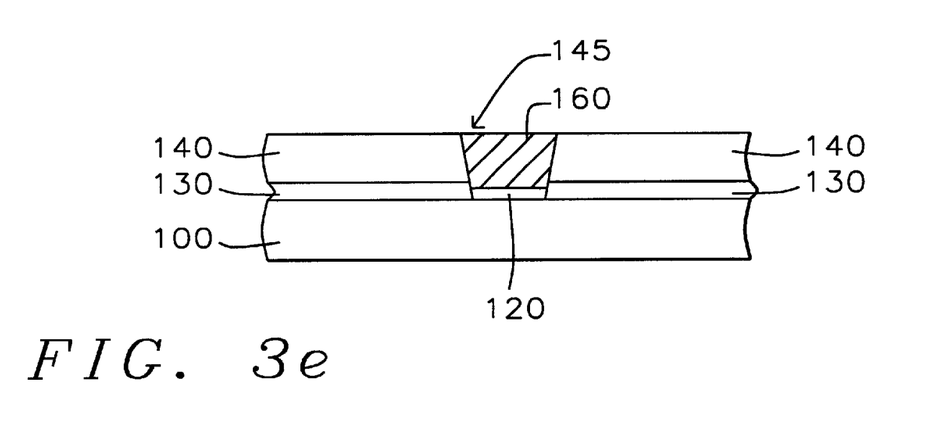
FIG. 3e is a cross-sectional view of a portion of a semiconductor substrate showing the forming of the first polysilicon layer in the tapered opening of FIG. 3d, according to this invention.

The etching of nitride layer is continued until it stops on pad oxide layer (130) in opening (145), also shown in FIG. 3d. Pad oxide is next removed until the underlying silicon substrate is exposed, using dry etch recipe comprising $CF_4$, $CHF_3$ and $O_2$. Or, 1% hydrofluoric HF solution can also be used for wet etching. Then, gate oxide (120), shown in FIG. 3e, is formed over the silicon substrate exposed in tapered opening (145), preferably through thermal growth at a temperature between about 750 to 900° C., and to a thickness between about 70 to 120 Å. This is followed by depositing a first polysilicon layer (160) over the substrate, including gate oxide layer (120) in opening (145), through reduction of SiH₄ using LPCVD at a temperature between about 500 to 650° C. The preferred thickness of the first layer of polysilicon is between about 800 to 1500 Å. Next, the substrate is subjected to chemical-mechanical polishing (CMP) using nitride layer (140) as a polishing stop, resulting in the structure shown in FIG. 3e. It will be noted that the substrate is planarized and the surface of the first polysilicon layer (160) in opening (145) is level with the surface of the surrounding nitride layer (140).

Figure 3F:
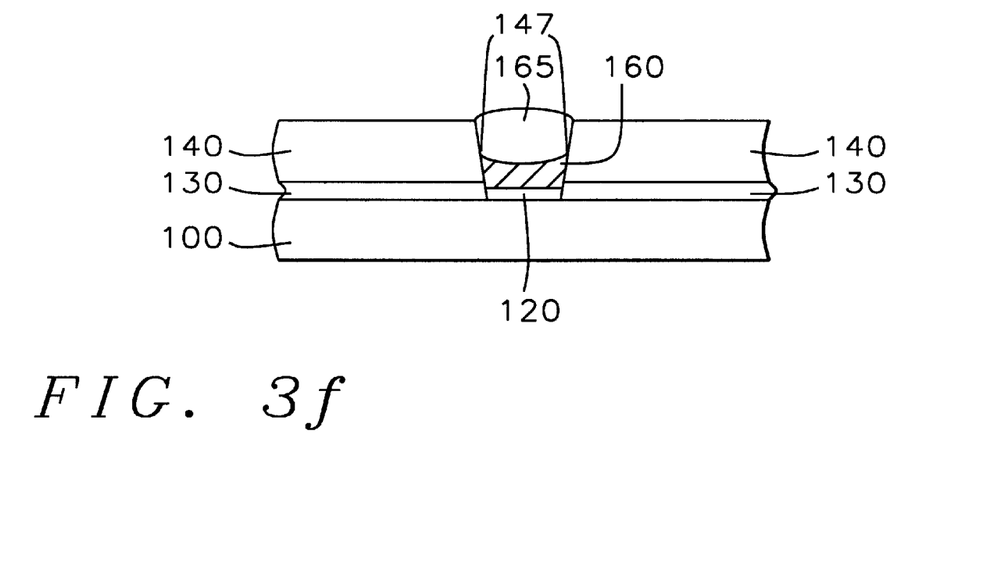
FIG. 3f is a cross-sectional view of a portion of a semiconductor substrate showing the forming of the tapered polyoxide of this invention.

As another key aspect of the present invention, the first polysilicon so formed in opening (145) with tapered walls is next oxidized, preferably, by wet oxidation at a temperature between bout 850 to 950° C. to form poly-oxide (165), as shown in FIG. 3f. The thickness of poly-oxide is between about 1000 to 1800 Å. It is important that the wall of the polysilicon in opening (145) is tapered so that the resulting poly tip (147) underlying the poly oxide at the edge of the polysilicon subsequent to the oxidation is sharp and robust. It will be appreciated that with a vertical wall, the protrusion under the poly oxide will be less sharp due to the verticality and also longer, thus more susceptible to damage during the subsequent process steps. It will also be appreciated that the sharpness of the [polyoxide tip] poly tip is enhanced by the fact that the shape of the poly-oxide over the floating gate is trapezoidally curvilinear at the bottom as well as at the top as seen in FIGS. 3f–3i. Due to the taper of the sidewalls, the top surface has a wider dimension than the bottom surface. And, because the lower curvilinear surface replicates itself in the underlying polysilicon layer, polyoxide tip is longer and sharper than it would otherwise be with a floating gate having a flat top surface. Because of the concave shape of the floating gate (160) top surface formed as a result of oxidation to form the poly-oxide (165) a reproducible inclined top surface is presented at the periphery of the top surface. Taking advantage of this reproducible inclined peripheral edge shape of the top surface of the floating gate together with forming sidewalls on the floating gate with a specified inclination (149), a robust and reproducible sharp poly tip can be realized at the intersection of the top and sidewall surfaces.

Figure 3G:
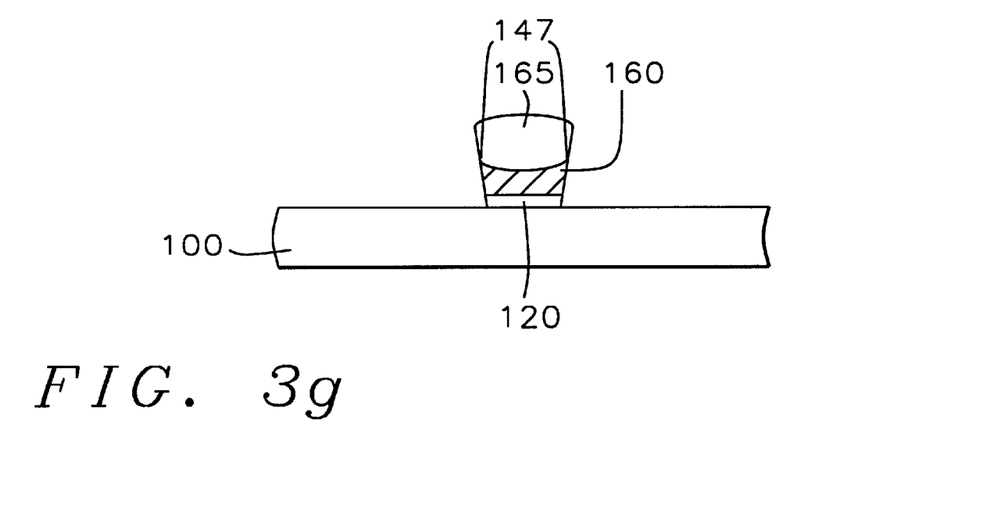
FIG. 3g is a cross-sectional view of a portion of a semiconductor substrate showing the forming of the tapered floating gate of this invention.

After having formed the poly tip, (147), of this invention, nitride layer (140) is removed by using a wet solution of H₃PO₄, or, phosphoric acid, leaving the structure shown in FIG. 3g. Then, the completion of the split-gate is accomplished by first blanket depositing (not shown) over the substrate an interpoly oxide layer(170) shown only in a portion of the substrate depicted in FIG. h. It is preferred that layer (170) is oxynitride, which is well known in the art, and that it has a thickness between about 150 to 300 Å. At the final step, a second layer of polysilicon is deposited over interpoly oxide as shown in the same FIG. 3h and is patterned to form the control gate, (180). It is preferred that the second layer of polysilicon is formed using silicon source SiH₄ in an LPCVD charmer at a temperature between about 500 to 650° C., and that it has a thickness between about 1000 to 3000 Å.

Figure 3H:
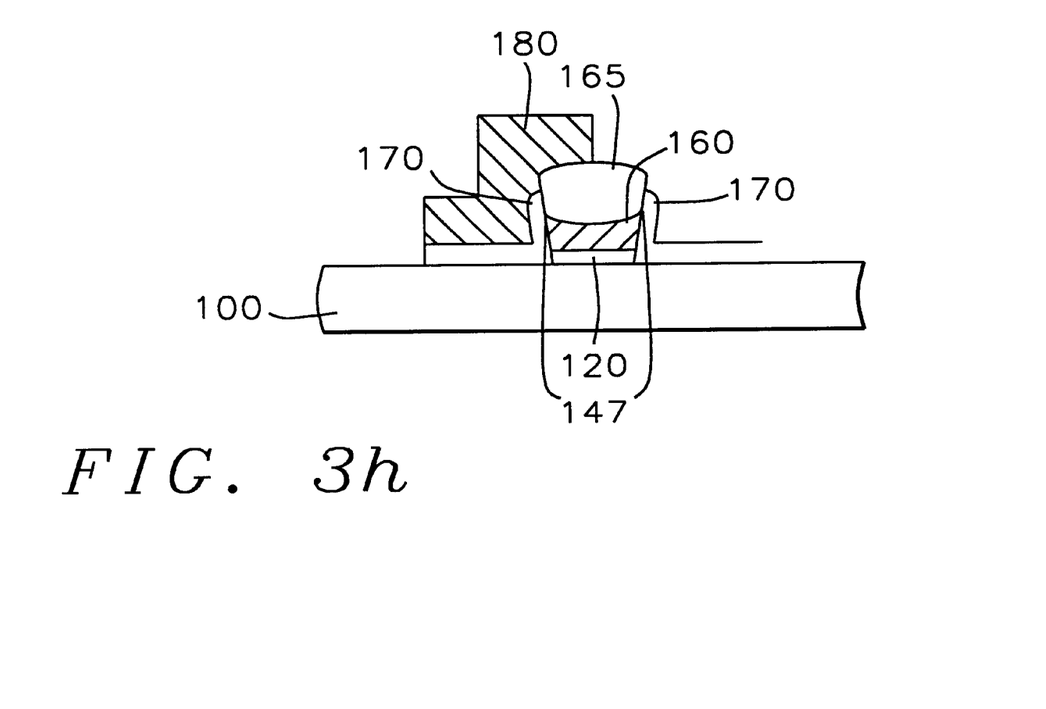
FIG. 3h is a cross-sectional view of a portion of a semiconductor substrate showing the completion of a split-gate flash memory cell with the sharp poly tip of this invention.
Figure 3I:
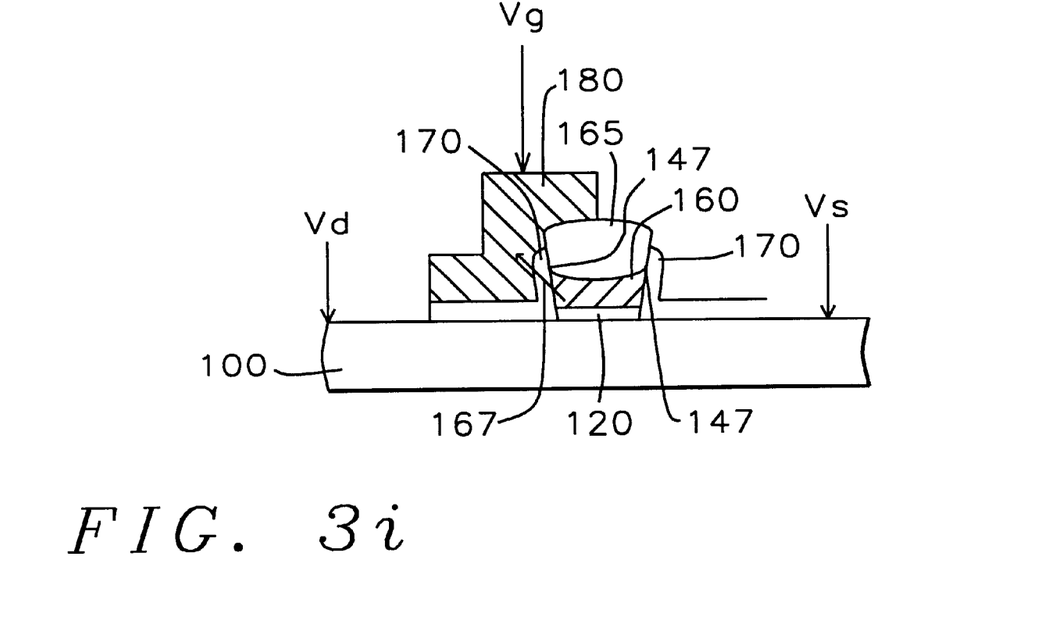
FIG. 3i is a cross-sectional view of a portion of a semiconductor substrate showing the erasing of the split-gate flash memory cell with the sharp ply tip of this invention.

Thus, in the erasing operation of the cell shown in FIG. 3h, source and drain voltages or, $V_s$ and $V_d$, in FIG. 3i, are set to a level of 0 volt, while the gate voltage Vg is set to 11 volts.

While the invention has been particularly shown Land described with reference to the preferred embodiments thereof, it will be understood by those skilled in the art that various changes in form and details may be made without departing from the spirit and scope of the invention.

What is claimed is:

1. A split-gate flash memory cell having a sharp poly tip comprising:

a substrate having active and field regions defined;

a floating gate overlying but separated from said substrate by gate oxide;

said floating gate having a top surface with peripheral areas;

said floating gate having inclined sidewalls;

a poly-oxide layer overlying said floating gate forming an interface that is concaved into the top surface of said floating gate, said top surface peripheral areas being inclined;

a poly tip formed at the intersection of the said inclined sidewalls and said inclined top surface peripheral areas of said floating gate; and a control gate disposed over said floating gate with interpoly oxide therebetween.

2. The split-gate memory cell of claim 1, wherein said floating gate has a thickness between about 800 to 1500 Å.

3. The split-gate memory cell of claim 1, wherein said control gate a thickness between about 1000 to 3000 Å.

4. The split-gate memory cell of claim 1, wherein said inclined sidewalls have a slope between about 60 to 80 degrees from the horizontal.

* * * * *